US012733137B2

(12) United States Patent
S et al.

(10) Patent No.: US 12,733,137 B2
(45) Date of Patent: Sep. 8, 2026

(54) THERMALLY CONDUCTIVE POLYMER ENCLOSURE FOR AN ELECTRICAL SYSTEM

(71) Applicant: Eaton Intelligent Power Limited, Dublin (IE)

(72) Inventors: Jayakrishnan S S, Kollam (IN); Vipin Bokade, Warora (IN); Chinmaya Rajiv Dandekar, Pune (IN); Michael K. Balck, East Grand Rapids, MI (US)

(73) Assignee: Eaton Intelligent Power Limited, Dublin (IE)

( * ) Notice: Subject to any disclaimer, the term of this patent is extended or adjusted under 35 U.S.C. 154(b) by 381 days.

(21) Appl. No.: 17/987,102

(22) Filed: Nov. 15, 2022

(65) Prior Publication Data

US 2023/0209782 A1 Jun. 29, 2023

(30) Foreign Application Priority Data

Dec. 24, 2021 (IN) ............................ 202111060561

(51) Int. Cl.
*H02M 5/458* (2006.01)
*H05K 7/20* (2006.01)

(52) U.S. Cl.
CPC ............ *H05K 7/209* (2013.01); *H02M 5/458* (2013.01); *H05K 7/20909* (2013.01)

(58) Field of Classification Search
CPC ............... H05K 7/209; H05K 7/20409; H05K 7/20918; H05K 5/0217; H05K 7/2039;
(Continued)

(56) References Cited

U.S. PATENT DOCUMENTS 8,421,273 B2 4/2013 Schmidt
8,992,649 B2 3/2015 Manahan et al.
(Continued)

FOREIGN PATENT DOCUMENTS

CN 102867572 A 1/2013
CN 207151004 U 3/2018
(Continued)

OTHER PUBLICATIONS

Office Action, counterpart Chinese Application No. 202211649726.9, issued Sep. 19, 2025, 24 pages total (including English language translation of 14 pages).

(Continued)

*Primary Examiner* — Adam B Dravininkas
(74) *Attorney, Agent, or Firm* — DiBerardino McGovern IP Group LLC

(57) ABSTRACT

An apparatus includes: a power converter including a plurality of electronic switches, the electronic switches being controllable to produce a driver signal having a variable amplitude, frequency, and/or phase; and a single-piece base made of a thermally conductive polymer material. The single-piece base includes: a first side configured to hold the power converter; a second side; and one or more heat dissipating elements that extend from the second side. The heat dissipating elements are configured to dissipate heat generated by the electronic switches, and each of the one or more heat dissipating elements is made of the thermally conductive polymer material.

24 Claims, 8 Drawing Sheets

(58) Field of Classification Search
CPC .......... H05K 7/20418; H05K 7/20909; H02M 5/458; H02M 1/327; H02M 7/003; H02M 7/5395
See application file for complete search history.

(56) References Cited

U.S. PATENT DOCUMENTS

| | | | |
|---|---|---|---|
| D905,323 S | 12/2020 | Scarlata et al. | |
| 2006/0044762 A1* | 3/2006 | Kikuchi | H05K 7/209 257/E23.105 |
| 2014/0247554 A1* | 9/2014 | Sharma | H01F 27/02 312/223.1 |
| 2018/0320879 A1* | 11/2018 | Das | F21V 29/85 |
| 2020/0132264 A1 | 4/2020 | Scarlata et al. | |
| 2020/0385624 A1 | 12/2020 | Zekriardehani et al. | |
| 2021/0172586 A1* | 6/2021 | Burmeister | F21V 19/003 |
| 2021/0215332 A1 | 7/2021 | Scarlata et al. | |
| 2021/0262652 A1 | 8/2021 | Aanegola et al. | |

FOREIGN PATENT DOCUMENTS

| | | |
|---|---|---|
| CN | 212163873 U | 12/2020 |
| WO | 2018037209 A2 | 3/2018 |

OTHER PUBLICATIONS

Office Action, counterpart Chinese Application No. 202211649726.9, issued Apr. 14, 2026, 24 pages total (including English language translation of 16 pages).

* cited by examiner

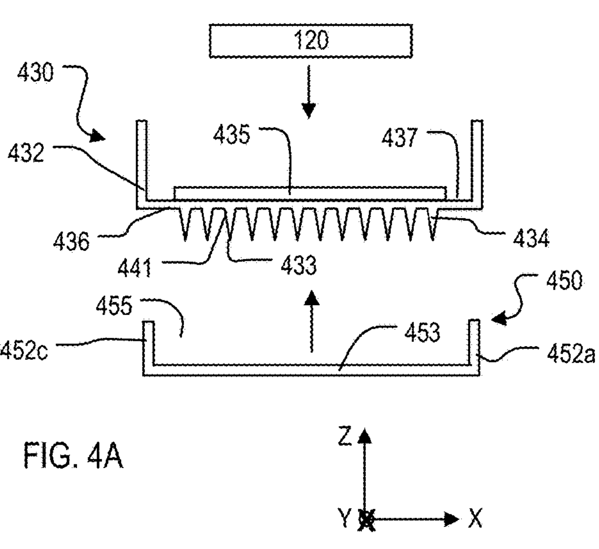
FIG. 4A
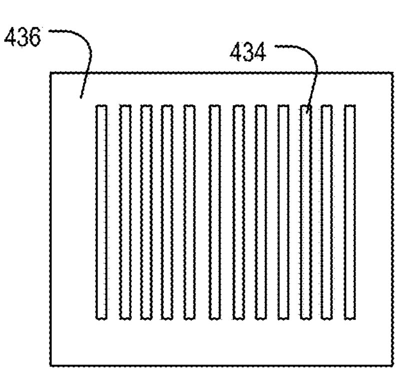
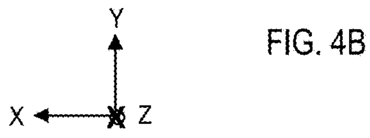
FIG. 4B
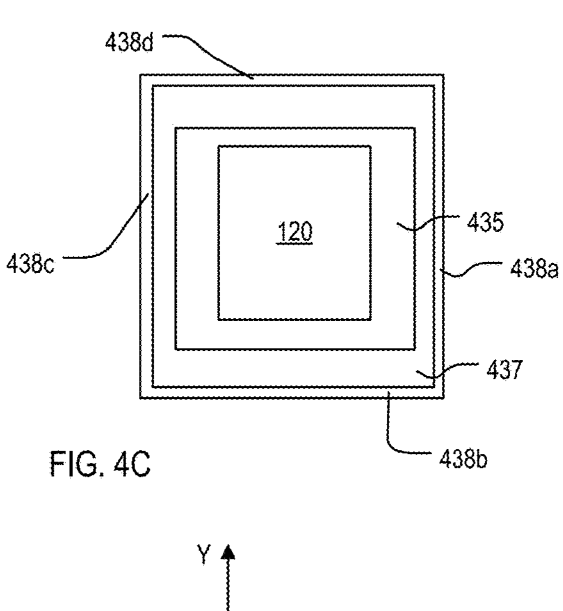
FIG. 4C
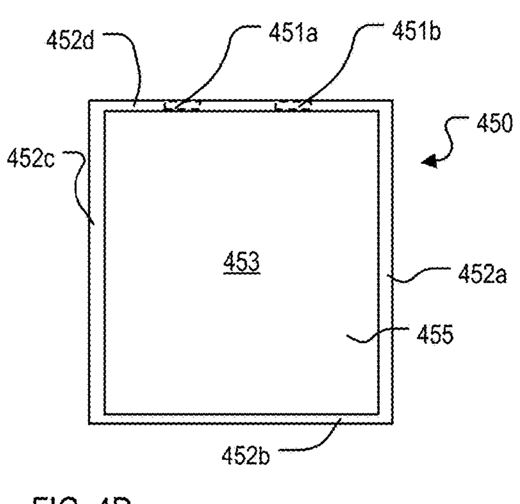
FIG. 4D
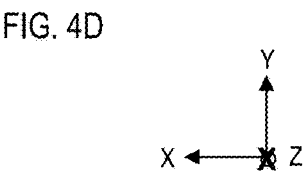

THERMALLY CONDUCTIVE POLYMER ENCLOSURE FOR AN ELECTRICAL SYSTEM

CROSS-REFERENCE TO RELATED APPLICATION

This application claims the benefit of Indian Provisional Application No. 202111060561, filed on Dec. 24, 2021 and titled THERMALLY CONDUCTIVE POLYMER ENCLOSURE FOR AN ELECTRICAL SYSTEM, which is incorporated herein by reference in its entirety.

TECHNICAL FIELD

This disclosure relates to a thermally conductive polymer enclosure for an electrical system. The electrical system may be, for example, a variable frequency drive (VFD).

BACKGROUND

An electrical apparatus or an electrical system, such as a variable speed drive, an adjustable speed drive, or an uninterruptable power supply, may be connected to an alternating current (AC) high-power electrical distribution system, such as a power grid. The electrical apparatus drives, powers, and/or controls a load, such as a motor, a machine, or a non-machine. The electrical apparatus includes an electrical network that converts AC power to direct-current (DC) power.

SUMMARY

In one aspect, an apparatus includes: a power converter including a plurality of electronic switches, the electronic switches being controllable to produce a driver signal having a variable amplitude, frequency, and/or phase; and a single-piece base made of a thermally conductive polymer material. The single-piece base includes: a first side configured to hold the power converter; a second side; and one or more heat dissipating elements that extend from the second side. The heat dissipating elements are configured to dissipate heat generated by the electronic switches, and each of the one or more heat dissipating elements is made of the thermally conductive polymer material.

In another aspect, an enclosure includes: a single-piece base made of a thermally conductive polymer material; and a mounting structure configured to attach the single-piece base to a separate structure. The single-piece base includes: a first side configured to hold one or more electronic components that generate heat in use; a second side; and one or more heat dissipating elements that extend from the second side. The one or more heat dissipating elements are configured to dissipate heat generated by the one or more electronic components, and each of the one or more heat dissipating elements is made of the thermally conductive polymer material. The mounting structure includes: a first portion configured to attach to the second side of the single-piece base; and side portions that extend from the first portion. When the mounting structure is attached to the second side of the single-piece base, the first portion extends over the one or more heat dissipating elements.

Implementations of any of the techniques described herein may include an apparatus, a device, a system, and/or a method. The details of one or more implementations are set forth in the accompanying drawings and the description below. Other features will be apparent from the description and drawings, and from the claims.

DRAWING DESCRIPTION

FIG. 4A is a side cross-sectional block diagram of an enclosure and a mounting element.

FIGS. 4B and 4C are additional views of the enclosure of FIG. 4A.

FIG. 4D is an additional view of the mounting element of FIG. 4A.

DETAILED DESCRIPTION

Figure 1:
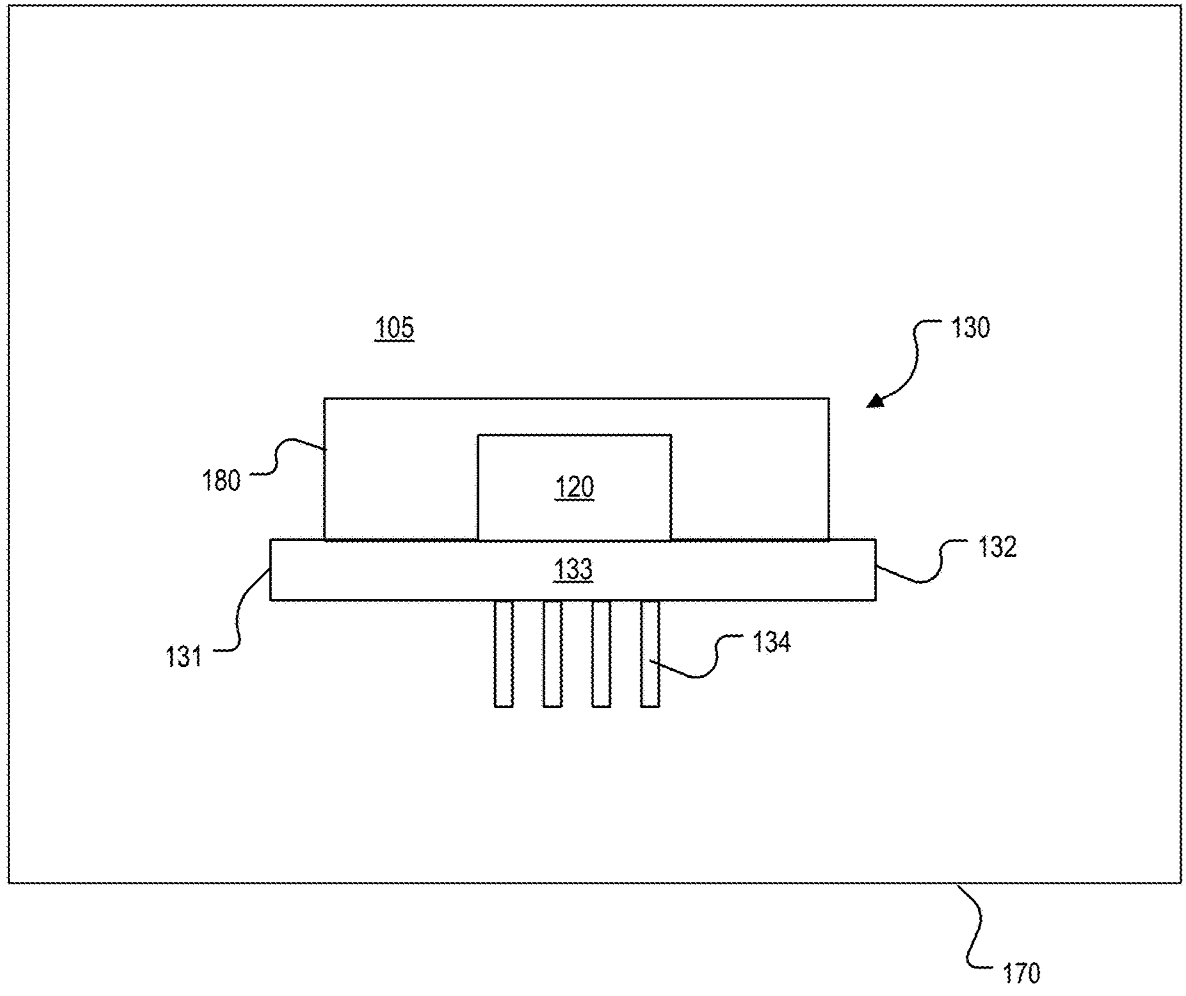
FIG. 1 is a block diagram of an example of an enclosure.

Referring to FIG. 1, a block diagram of an apparatus 105 that includes an enclosure 130 and an electrical system 120 is shown. The enclosure 130 is used in a harsh and/or hazardous environment 170 and an exterior 131 of the enclosure 130 is exposed to the elements of the environment 170. The environment 170 is represented by a box in FIG. 1. However, the environment 170 is not necessarily an enclosed space. For example, the environment may be an outdoor space or a partially enclosed space. The environment 170 may be an indoor space, such as a space within an industrial facility or a manufacturing facility. The enclosure 130 may be attached to other components and elements. For example, in FIG. 1, the enclosure 130 is attached to a front panel 180 for the electrical system 120. The front panel 180 may include devices (for example, user interfaces and/or indicators) that allow an operator to interact with the electrical system 120. In another example, the enclosure 130 may be attached to a mounting element that is used to mount the enclosure to a separate structure, such as a cabinet. The mounting element 450 of FIG. 4A and FIG. 4E is an example of a mounting element that may be attached to the enclosure 130. In some implementations, the enclosure 130 includes a mounting element that allows the enclosure 130 to be mounted to a separate structure. In other words, the mounting element may be part of the enclosure 130 and is not necessarily a separate element.

As discussed in greater detail below, the enclosure 130 includes a base portion 132 and one or more heat-dissipating elements 134. The base portion 132 and the one or more heat-dissipating elements 134 are a single, unitary, and integral structure made from a material 133. The base portion 132 and the one or more heat-dissipating elements 134 may be formed into the structure by, for example, injection molding or extrusion. The material 133 withstands the harsh and/or hazardous environment 170. For example, the material 133 is capable of being exposed to corrosive chemicals, moisture, fluids, ultraviolet radiation, rain, salt, heat, cold, and/or thermal cycling without disintegrating or experiencing substantial damage. The enclosure 130 thus allows the apparatus 105 to be used in the environment 170 and/or extends the amount of time during which the apparatus 105 may be used in the environment 170. For example, the enclosure 130 may allow the apparatus 105 to be used underground, in a marine environment (such as on a ship or an off-shore rig), in desert areas, in areas prone to fire and/or extreme temperature swings, in areas prone to flooding and water ingress, in icy conditions, in environments that include potentially damaging and/or corrosive gasses (such as, for example, carbon dioxide ($CO_2$) and/or sulfur dioxide ($SO_2$)), in environments that include corrosive fluids (for example, salt water), and/or in a refinery or other industrial setting.

The material 133 may be a thermally conductive polymer (TCP). The TCP is a polymer matrix incorporated with one or more thermally conductive fillers. Incorporating the thermally conductive fillers increases the thermal conductivity of the material 133 and increases the mechanical strength and corrosion resistance of the material 133. The specific properties (for example, resistance to particular chemicals) of the TCP depends on the polymer matrix that is chosen and the fillers. The addition of the fillers to the polymer matrix may increase thermal conductivity of the material 133 by up to about 20 to 30 watts per meter-kelvin (W/m*K) along the fiber direction. A typical thermal conductivity of a polymer matrix without fillers may be about 0.2 W/m*K. The increase in thermal conductivity enables the material 133 to dissipate heat generated by the electrical system 120. The fillers also increase the impact and tensile strength of the material 133. The improved thermal conductivity, impact strength, tensile strength, and corrosion resistance results in the material 133 being suitable for use as the enclosure 130.

Figure 3:
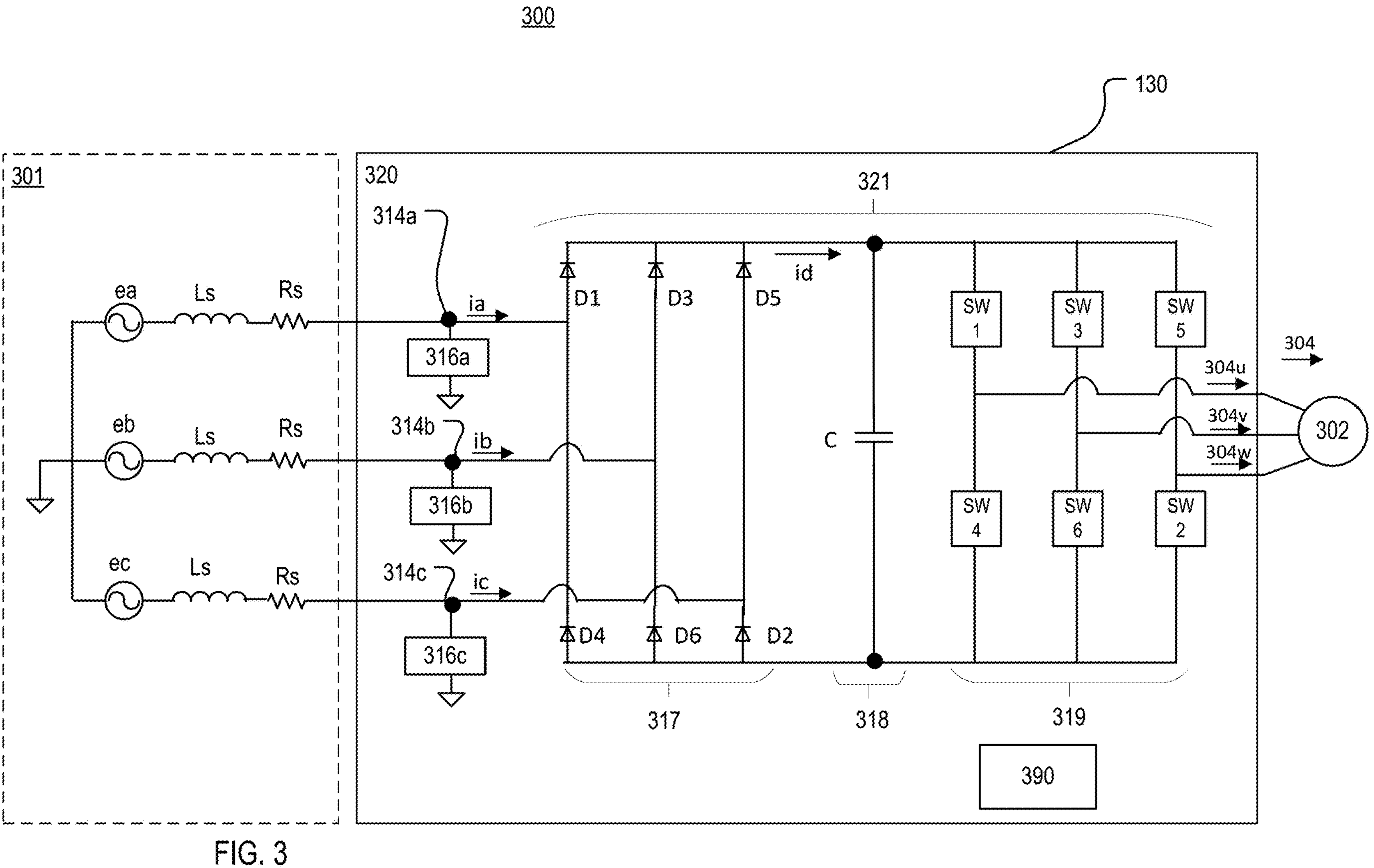
FIG. 3 is a schematic of an electrical system that may be part of the AC driving system of FIG. 2.

The electrical system 120 generates heat during use and may be, for example, a power converter (such as shown in FIG. 3), a variable speed drive (VSD), a variable frequency drive (VFD), a variable-voltage/variable-frequency (VVVF) drive, an inverter, a recloser, a circuit breaker, an uninterruptable power supply (UPS), a component in a switchgear, just to name a few. The electrical system 120 is made of any type of element that generates heat. For example, the electrical system 120 may include an electronic switch, power semiconductor device, discrete electronic device, a parasitic electronic component, a plurality of any of such components, or a combination of such components.

Some legacy enclosures that house a system such as the electrical system 120 include exterior metallic heat sinks to help dissipate heat generated during operational use. However, the metallic material of these heat sinks is susceptible to degradation and/or failure when exposed to an environment that damages the metallic material. Thus, a legacy system that includes an exposed heat sink made of a metallic material or other corrosion-prone material is generally not ideal for a harsh and/or hazardous environment, such as the environment 170. An example of a traditional metallic material used for heat sinks is aluminum.

On the other hand, the enclosure 130 uses the heat-dissipating elements 134 (which are made of the material 133) as a heat sink. Although the heat-dissipating elements 134 are on the exterior 131 of the enclosure 130, the heat-dissipating elements 134 are made of the material 133 and are resistant to corrosion while still providing thermal protection. The amount of the material 133 used in the enclosure 130 weighs less than the amount of a traditional metallic material used in a legacy enclosure. Thus, in addition to providing superior environmental protection, the enclosure 130 is also lighter than a traditional enclosure.

Figure 2:
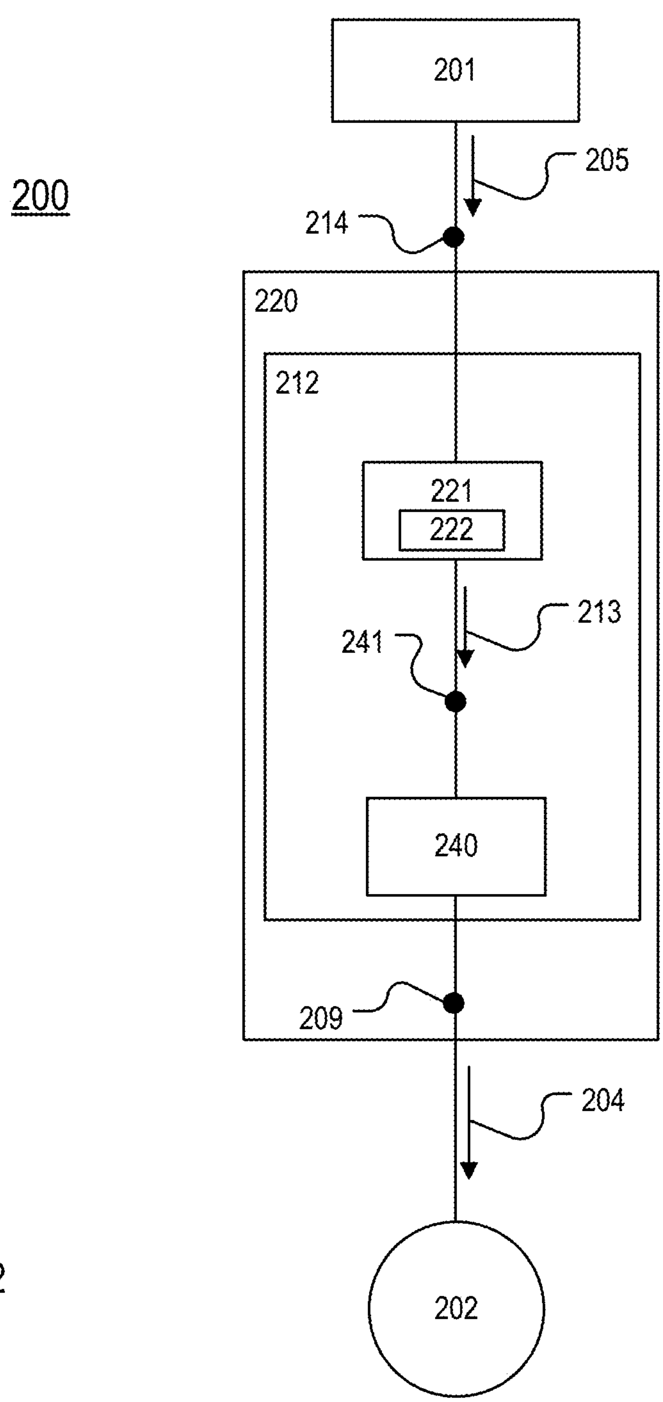
FIG. 2 is a block diagram of an AC driving system that may be housed in the enclosure of FIG. 1.

Before discussing various implementations of the enclosure 130 in more detail, an example of the electrical system 120 is provided in FIGS. 2 and 3. FIG. 2 is a block diagram of a system 200 that includes an AC driving system 220. The AC driving system 220 is electrically connected to an alternating current (AC) electrical power distribution network 201. The AC driving system 220 generates an AC driver signal 204 based on AC electrical power 205 from the network 201, and the AC driving system 220 provides the AC driver signal 204 to a load 202.

The electrical power distribution network 201 may be, for example, a multi-phase electrical power grid that provides electricity to industrial, commercial and/or residential customers. The AC electrical power distribution network 201 distributes AC electrical power that has a fundamental frequency of, for example, 50 or 60 Hertz (Hz). The distribution network 201 may have an operating three-phase line-to-line voltage of, for example, up to 690 volt (V) root mean square (RMS) for low voltage, and above 690V such as 10 kV for medium or high voltage. The network 201 may include, for example, one or more transmission lines, distribution lines, power distribution or substation transformers, electrical cables, and/or any other mechanism for transmitting electricity. The load 202 may be, for example, an induction machine, an induction motor, or a synchronous permanent magnet machine that operates at a speed and torque that is determined by the AC driver signal 204.

The AC driving system 220 is any type of apparatus that is capable of producing the AC driver signal 204. The AC driving system 220 may be, for example, a variable speed drive (VSD), an adjustable speed drive (ASD), or a variable frequency drive (VFD). The AC driving system 220 and the load 202 may be used in an industrial process. The industrial process may be, for example, a conveying process; a heating, ventilation, and air conditioning (HVAC) process; a natural gas or oil refining process; a mining process; a lighting process; or a pumping process.

The AC driving system 220 includes an electrical system 212. The electrical system 212 receives AC electrical power 205 from the distribution network 201 at an input node 214 and provides an the AC driver signal 204 via an output node 209. The electrical system 212 includes a rectifier assembly 222 and an inverter 240. The rectifier assembly 222 includes an electrical network 224 that converts the AC electrical power 205 into direct current (DC) electrical power 213. The electrical network 224 may be, for example, a plurality of diodes that are arranged to form a rectifier, for example, a 6-pulse, 12-pulse, or 18-pulse rectifier. The electrical network 224 may be a collection of transistors arranged to form a rectifier. The inverter 240 converts the DC electrical power 213 into the AC driver signal 204.

FIG. 3 is a schematic of an electrical system 320. The electrical system 320 is an example of an implementation of the electrical system 220 (FIG. 2). The electrical system 320 is a three-phase system that receives electricity from an electrical power distribution network 301. The electrical power distribution network 301 includes three phases, which are referred to as a, b, and c. Each phase has a respective voltage ea, eb, ec. The impedance of the distribution network 301 is represented by an inductor Ls in series with a resistance Rs. The impedance of the distribution network 301 depends on the impedance characteristics of the components included in the distribution network 301.

The electrical system 320 includes input nodes **314*a*, 314*b*, 314*c*, each of which is electrically coupled to one of the three phases of the distribution network 301. In the example of FIG. 3, the input node 314*a* is electrically connected to the a phase, the input node 314*b* is electrically connected to the b phase, and the input node 314***c* is electrically connected to the c phase.

The electrical system 320 includes an electrical network 312. The electrical network 312 includes a rectifier 317, a DC link 318, and an inverter 319. The rectifier 317 shown in FIG. 3 is a three-phase six-pulse bridge that includes six electronic switches. In the example of FIG. 3, the six electronic switches are diodes D1-D6. However, other implementations are possible. For example, transistors may be used as the electronic switches in the rectifier 217. Moreover, other configurations of the rectifier 317 are possible. For example, the rectifier 217 may be a three-phase, 12-pulse rectifier or an 18-pulse rectifier.

In the example of FIG. 3, the input node 314*a* is electrically connected to the anode of the diode D1 and the cathode of the diode D4. The input node 314*b* is electrically connected to the anode of the diode D3 and the cathode of the diode D6. The input node 314*c* is electrically connected to the anode of the diode D5 and the cathode of the diode D2. The diodes D1-D6 rectify the input currents ia, ib, ic into a DC current id.

The cathode of each diode D1, D3, D5 is electrically connected to the DC link 318, and the anode of each diode D2, D4, D6 is electrically connected to the DC link 318. The DC link 318 includes a capacitor network C. The rectified current id flows into the capacitor network C and is stored. The capacitor network C includes one or more capacitors that store electrical energy when the rectified current id flows from the rectifier 317 and discharge the stored electrical energy when the rectified current id does not flow from the rectifier 317.

The inverter 319 converts the DC power stored in the capacitor network C into a three-phase AC driver signal 304 that is provided to a three-phase load 302. The three-phase driver signal 304 has phase components 304*u*, 304*v*, 304*w*, each of which is provided to one phase of the load 302. The inverter 319 includes a network of electronic switches SW1-SW6 that are arranged to generate the driver signal 304. Each of the switches SW1-SW6 may be, for example, a power transistor, such as an insulated gate bipolar transistor (IGBT). Because the inverter 319 uses the electrical energy stored in the DC link 318, the driver signal 304 continues to be produced as expected and load 302 may function under normal and expected load conditions even if the magnitude of the current that flows in the rectifier 317 and into the DC link 318 increases to a level that may damage the components in the rectifier 317 and the DC link 318.

The state of the switches SW1-SW6 is controlled by a control system 390. The control system 390 may be a microcontroller or another type of electronic control. The control system 390 may control the state of the switches SW1-SW6 of the inverter 340 to implement, for example, a pulse width modulation (PWM) technique to modulate the energy that is stored in the capacitor network 326 into the AC driver signal 304. The PWM technique may be implemented based on any type of control algorithm, such as, for example, a 6-step electronic commutation, various field oriented controls, a space vector PWM, or a sinusoidal PWM. The switching of the electronic switches SW1 through SW6 is controlled such that the amplitude, frequency, and phase of the driver signal 304 is also controlled. The amplitude, frequency, and phase of the driver signal 304 determines the operating properties (for example the torque, speed, and/or direction) of the load 302.

The topology shown in FIG. 3 is provided as an example, and other topologies may be used. Moreover, although the electrical system 320 implements a motor driver that includes the rectifier 317 and the inverter 318, the enclosure 130 may house other types of electrical systems that include components that generate heat during use.

FIGS. 4A-4C and FIG. 4F show an enclosure 430. The enclosure 430 is made of the material 133. As noted above, the material 133 may be a thermally conductive polymer (TCP). Thus, the enclosure 430 may be made of a thermally conductive polymer (TCP). The TCP may be a polymer matrix that includes thermally conductive fillers. A polymer matrix may be a composite material composed of a variety of short or continuous fibers bound together by an organic polymer matrix. The polymer matrix may include a resin material, a thermoplastic material, or a thermoset material. Examples of polymers that may be used in the TCP include, without limitation, thermoplastic polymers, for example, acrylonitrile butadiene styrene, acrylic, celluloid, cellulose acetate, cyclic olefin copolymer, ethylene-vinyl acetate, ethylene vinyl alcohol, polytetrafluoroethylene ethylene, ionomers, liquid crystal polymer, polyoxymethylene, polyacrylates, polyacrylonitrile, polyamide (for example, polyamide 66 or polyamide 6), polyamideimide, polyimide, polyaryletherketone, polybutadiene, polybutylene terephthalate, polycaprolactone, polychlorotrifluoroethylene, polyether ether ketone, polyethylene terephthalate, poly-cyclohexene diethylene terephthalate, polycarbonate, polyhydroxyalkanoates, Polyketone, polyester, polyolefin (for example, polyethylene, polypropylene, polybutylene, and the like), polyether ketone, polyetherimide, polyether sulfone, polysulfone, chlorinated polyethylene, polylactic acid, polymethylmethacrylate, polymethyl pentene, polyphenylene, polyphenylene sulfide (PPS), polyphthalamide, polystyrene, polysulfone, polytrimethylene terephthalate, polyurethane, polyvinyl acetate, polyvinyl chloride, polyvinylidene chloride, styrene-acrylonitrile, or mixtures thereof.

The TCP includes thermally conductive filler, and the thermally conductive filler may be any filler known in the art. The thermally conductive filler increases the bulk thermal conductivity of the TCP. The thermally conductive filler may have a high thermal conductivity (for example, a thermal conductivity of up to about 900 watts per meter-kelvin (W/m*K) or greater than about 10 W/m*K), an intermediate thermal conductivity (for example, a thermal conductivity of from about 5 W/m*K to about 10 W/m*K), or a low thermal conductivity (for example, a thermal conductivity of less than about 5 W/m*K). A filler with a higher thermal conductivity (for example, a filler with an intermediate or high thermal conductivity) may result in a TCP with a higher thermal conductivity and may be beneficial in some implementations of the enclosure 430.

The thermally conductive filler may increase the tensile strength of the TCP as compared to the polymer matrix without the filler. The filler may include, for example, a macro-size filler (a filler having a size on the order of a micrometer) and/or a nano-size filler (a filler having a size on the order of a nanometer). The macro-size filler may include carbon fibers. The nano-size tensile strength filler may include, for example, nanodiamonds, carbon nanotubes, or mixtures thereof. The tensile strength of the filler may be, for example, from about 30 MPa to about 100 MPa. A mixture of nano-fillers and micro-fillers can significantly increase the impact strength of the TCP. Thus, in some implementations, the material 133 includes nano-fillers and micro-fillers, and may include additional fillers. In some implementations, an electrically conductive filler is incorporate into the polymer matrix.

In some implementations, the TCP includes one or more electrically conductive fillers. Electrically conductive fillers include, but are not limited to, carbon fibers, carbon nanotubes, and mixtures thereof.

Moreover, additional additives may be included in the TCP to provide modified characteristics, such as UV stability, fire retardancy and/or fire resistance. Examples of such additional additives include heat stabilizers, antioxidants, dyes, pigments, mold-release agents, lubricants, adhesion promoters, just to name a few.

Figure 4F:
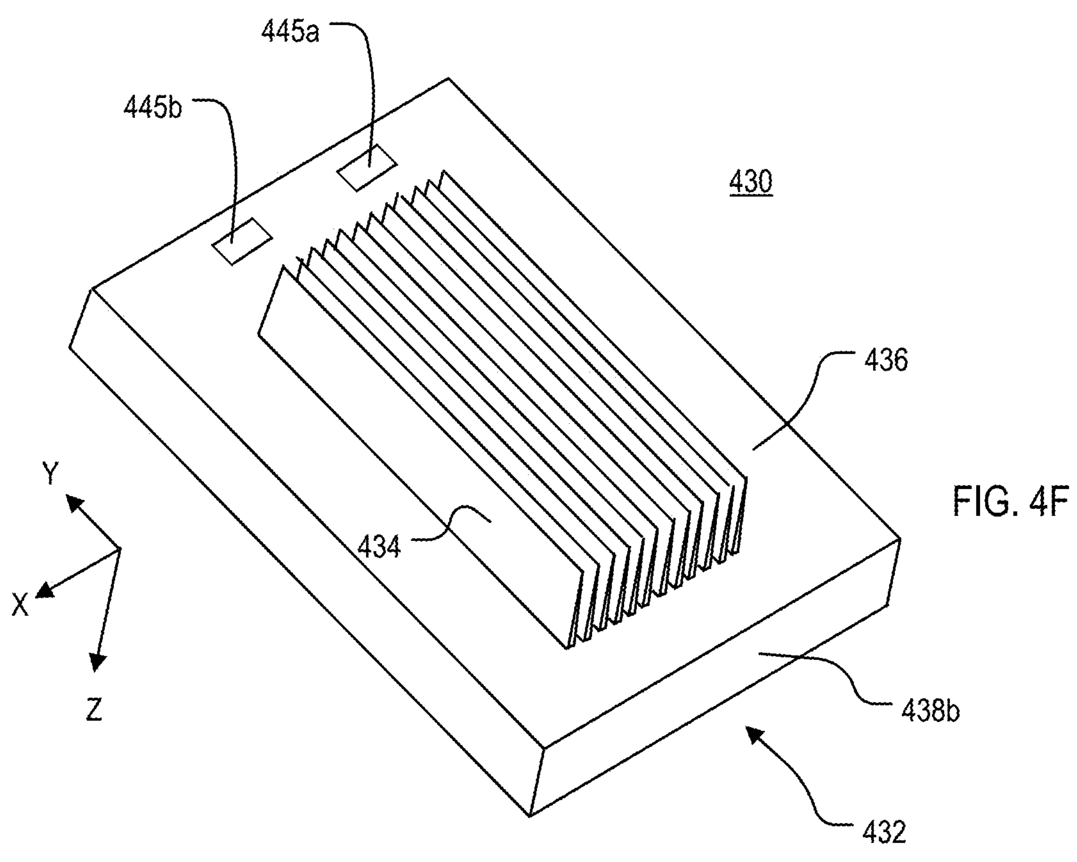
FIG. 4F is a perspective view of the enclosure of FIG. 4A.
Figure 4E:
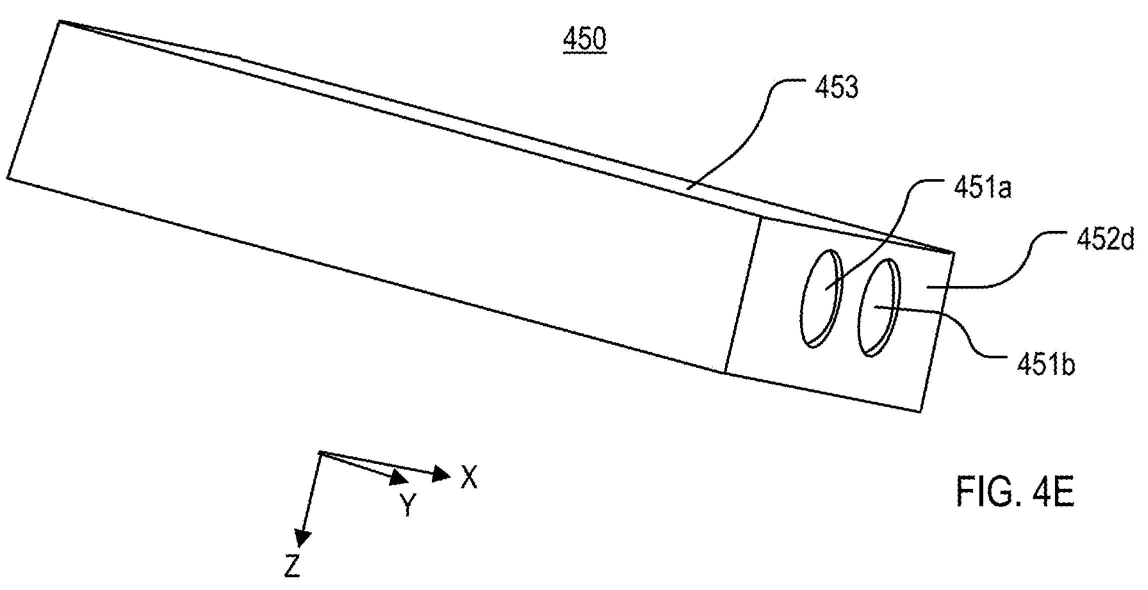
FIG. 4E is a perspective view of the mounting element of FIG. 4A.

FIG. 4A shows side cross-sectional views of the enclosure 430 and a mounting element 450 in the X-Z plane. FIG. 4F is a perspective view of the enclosure 430. The enclosure 430 is a single-piece structure that is made of the material 133 and may be formed by, for example, injection molding or casting. The enclosure 430 includes a base portion 432 that has a first side 437 and a second side 436. The second side 436 is opposite the first side 437.

The first side 437 receives the electrical system 120. A plurality of heat-dissipating elements 434 extend from the second side 436. The heat-dissipating elements 434 act as a heat sink and dissipate heat that is generated by the electrical system 120 in operational use. In the example of FIG. 4A, the heat-dissipating elements 434 are tapered fins that extend from the second side 436 generally in the −Z direction. The tapered fins 434 have a first end 441 at the second side 436 and extend to a tip 433. The first end 431 has a greater extent in the X direction than the tip 433 has in the X direction.

FIG. 4B shows the second side 436 in the X-Y plane. As shown in FIG. 4B, the tapered fins 434 also extend in the Y direction. In the example shown in FIGS. 4A, 4B, and 4E, the enclosure 430 includes twelve (12) fins 434 that are separated from each other with a constant spacing in the X direction. For simplicity, only one of the fins 434 is labeled. The fins 434 may be, for example 175 millimeters (mm) in length (the Y direction in FIGS. 4A and 4B), 40 mm in height (the −Z direction in FIGS. 4A and 4B), with the first end 441 having a thickness in the X direction of 4 mm and the tip 433 having a tapering angle of 2 degrees (°).

Other arrangements of the fins 434 are possible, and more or fewer fins may be used. The fins 434 may have dimensions other than those provided in the example above, and the various fins 434 may all have the same size and shape, or the size and shape of the fins 434 may vary such that at least one of the fins 434 has a different size or shape than at least one other of the fins 434. Moreover, the heat-dissipating elements 434 are not necessarily shaped like fins. Examples of other configurations of the heat-dissipating elements 434 are shown in FIGS. 5-12.

The heat-dissipating elements 434 are formed in the portion of the second side 436 that is opposite to a region of the first side 437 where the electrical system 120 is placed. Thus, depending on the arrangement and configuration of the electrical system 120, the heat-dissipating elements 434 may be formed in different or additional locations on the second side 436 than the arrangement shown in FIGS. 4A, 4B, and 4E.

Regardless of the specific configuration of the heat-dissipating elements 434, the heat-dissipating elements 434 remove heat from the electronics in the electrical system 120. The heat-dissipating elements 434 act as a heat sink. The heat-dissipating elements 434 are made of the material 133 and are thus less prone to corrosion and other types of environmental damage than traditional heat sinks made of metallic materials.

In the example of FIG. 4A, a thermally conductive spreader 435 is between the electrical system 120 and the first side 437. The thermally conductive spreader 435 is in thermal contact with the electrical system 120 and the first side 437, and the thermally conductive spreader 435 may be in physical contact with the electrical system 120 and/or the first side 437. The thermally conductive spreader 435 spreads or distributes the heat produced by the electronics in the electrical system 120 among the heat-dissipating elements 434.

The thermally conductive spreader 435 may be made of any thermally conductive material. For example, the thermally conductive spreader 435 may be a copper plate. In some implementations, the thermally conductive spreader 443 is 7 mm thick (in the Z direction in FIG. 4A). The extent of the thermally conductive spreader 435 in the X and Y directions of FIG. 4A depends on the configuration of the electronic components in the electrical system 120 and the heat-dissipating elements 434. In some implementations, the extent of the thermally conductive spreader 435 is the same as or slightly larger than the dimensions of the heat-dissipating elements 434 in the X and Y directions.

The base portion 432 also includes walls 438*a*, 438*b*, 438*c*, 438*d* (collectively the walls 438) that extend in the Z direction. The walls 438 are part of the single-piece structure and are made of the material 133. FIG. 4C shows the first side 437 and the walls 438 in the X-Y plane. In the example shown, the walls 438 surround the perimeter of the first side 437 to form a recess that receives the electrical system 120 and thermally conductive spreader 435.

The base portion 432 may be attached to separate elements. For example, the base portion 432 may be attached to the mounting element 450 (FIGS. 4A, 4D, and 4F). The mounting element 450 is a bracket or plate that is used to mount the enclosure 430 to a structure such as a cabinet. The mounting element 450 is separate and distinct from the base portion 432, and the mounting element 450 may be made of the material 133 or from another material, such as aluminum. The mounting element 450 is attached to the second side 436 of the base portion 432. The mounting element 450 may attach to the second side 436 with, for example, an adhesive or by a mechanical fastener such as screws or bolts.

FIG. 4D shows the mounting element 450 in the X-Y plane. FIG. 4F is a perspective view of the mounting element 450. The mounting element 450 is a three-dimensional object that includes a planar portion 453 and side walls 452*a*, 452*b*, 452*c*, 452*d* (collectively side walls 452) that extend from the planar portion 453. The side walls 452 surround the planar portion in the X-Y plane and form a recess 455. When the mounting element 450 is attached to the base portion 432, the heat-dissipating elements 434 are in the recess 455.

The wall 452*d* includes openings 451*a* and 451*b*. The openings 451*a* and 451*b* pass through the wall 452*d* in the Y direction. The openings 451*a* and 451*b* are positioned near the heat-dissipating elements 434 and allow air to flow from the vicinity of the heat-dissipating elements 434 to an exterior of the enclosure 430. Thus, the openings 451*a* and 451*b* encourage heat removal and improve the performance of the heat-dissipating elements 434. In some implementations, a fan or other active heat-removal element is positioned in the enclosure 430 between each opening 451*a*, 451*b* and the heat-dissipating elements 434. For example, and referring to FIG. 4D, an active heat-removal element may be mounted to the second side 436 at each of the positions 445*a* and 445*b*.

Other implementations of the mounting element 450 are possible. For example, the mounting element 450 is shown as a solid bracket-like structure with the solid planar portion 453 extending in the X-Y plane. However, the planar portion 453 may be partially open to reduce weight and encourage air flow in the enclosure 430.

Additional implementations are possible. For example, the mounting element 450 is shown as a separate element but may be formed as part of the base portion 432. In these implementations, the mounting element 450 is part of the single-piece structure and is not a separate element. In these implementations, the mounting element 450 is made of the material 133. In another example, the walls 452 may include more or fewer than two openings. Moreover, the openings may have different shapes or arrangements than the openings 451*a* and 451*b*. For example, in some implementations, the wall 452*d* includes a single slot-shaped opening that, when the mounting element 450 is attached to the base portion 432, extends along all of the heat-dissipating elements 434 in the X direction.

Moreover, the walls 438 of the base portion 432 may be attached to a separate element. For example, the base portion 432 may be attached to a front panel (such as the front panel 180 of FIG. 1) that is used with the electrical system 120. The front panel may include components such as a human-machine interface (HMI) and indicators. When attached to the base portion 432, the front panel extends between the walls 438*a* and 438*c* and the walls 438*b* and 438*d* to cover the electrical system 120.

Figure 5:
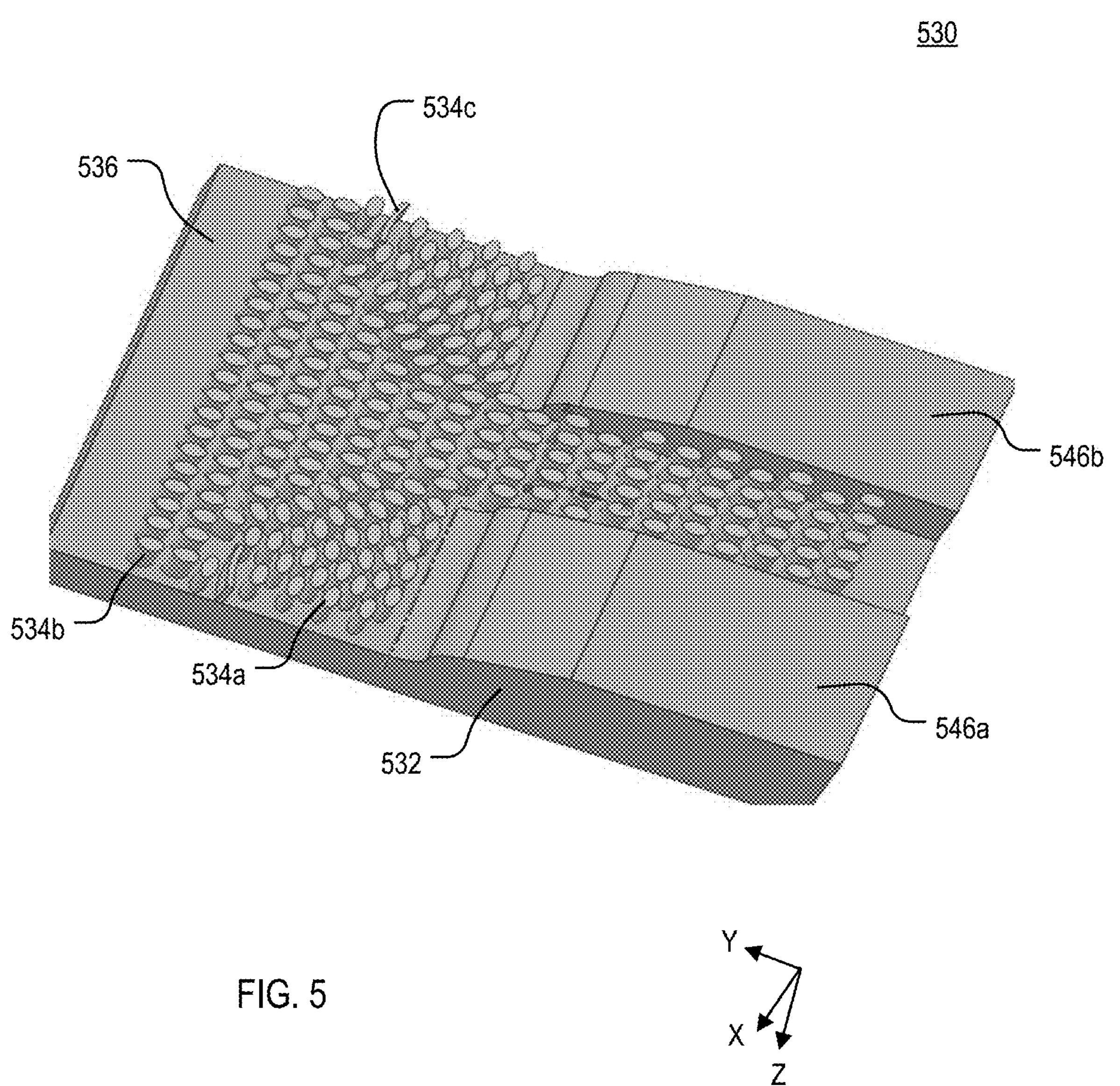
FIG. 5 is a perspective view of another example of an enclosure.

FIGS. 5-11 show additional implementations of the enclosure 130. FIG. 5 is a perspective view of an enclosure 530 that may be used to hold the electrical system 120 or another electrical system. The enclosure 530 is a single-piece structure and is made of the material 133. The enclosure 530 includes a base portion 532 that has a second side 536. Heat-dissipating elements 534 extend from the second side 536 in the −Z direction. The base portion 532, the second side 536, and the heat-dissipating elements 534 are a single-piece structure made of the material 133. For simplicity, fewer than all of the heat-dissipating elements 534 are labeled. The heat-dissipating elements 534 are not uniformly sized and shaped. For example, some of the heat-dissipating elements 534 (such as the heat-dissipating elements 534*a* and 534*b*) have an elliptical cross-section in the X-Y plane, and some of the heat-dissipating elements 534 (such as the heat-dissipating element 534*c*) have an arc cross-section in the X-Y plane. Moreover, the heat-dissipating elements 534 are not arranged in a uniform manner. For example, although the heat-dissipating elements 534*a* and 534*b* both have an elliptical cross-section in the X-Y plane, the elements 534*a* and 534*b* are oriented in different directions.

The enclosure 530 includes other features. For example, the enclosure 530 includes compartments 546*a* and 546*b* that are sized to accommodate components used with the electrical system 120. The compartments 546*a* and 546*b* form recesses in a first side (not shown in FIG. 5) of the base portion 532. The first side of the base portion 532 is opposite the second side 536. For example, the base portion 532 may receive capacitors or other components in the recesses.

Figures 6, 7, 8, 9, 10, 11:
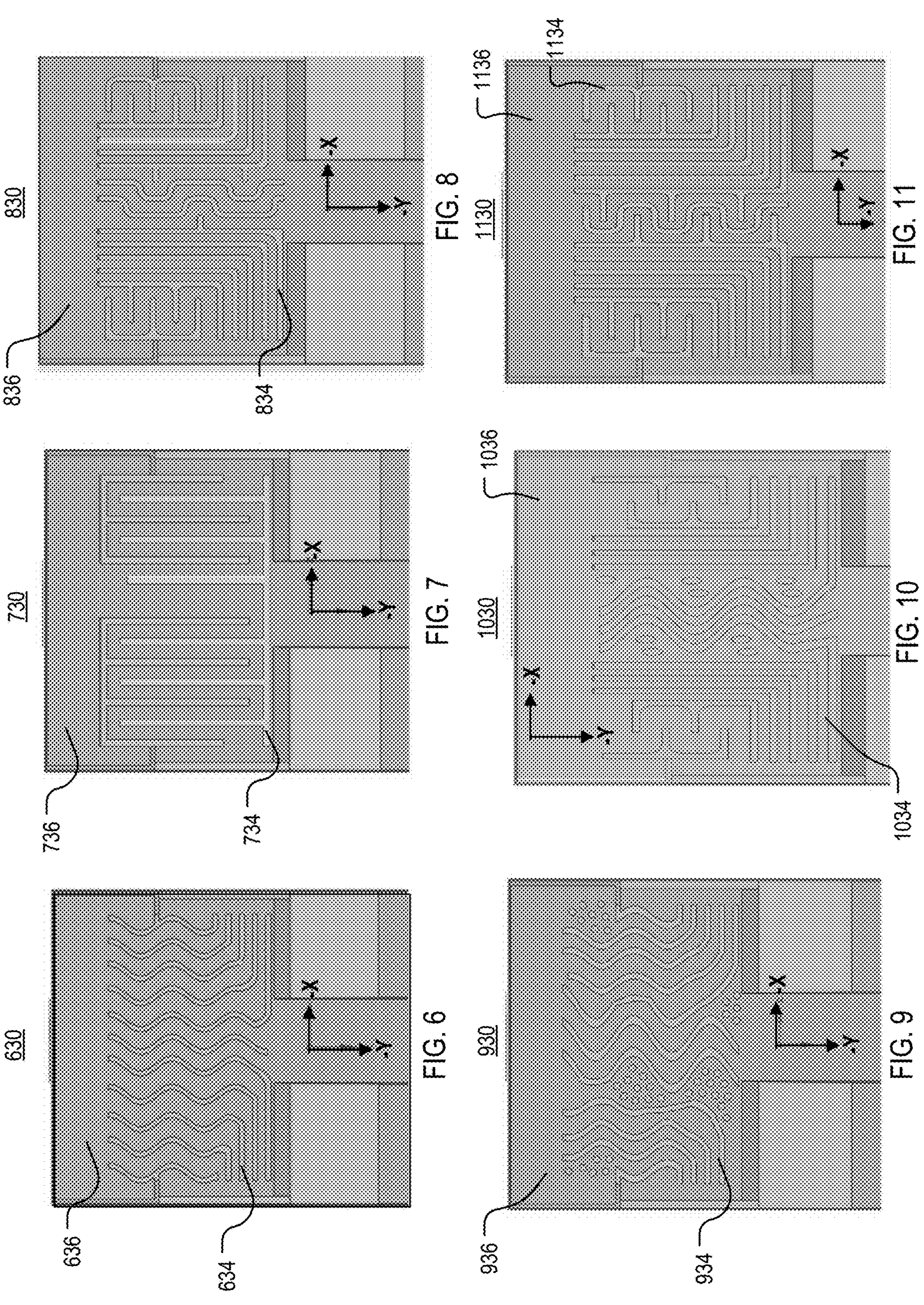
FIGS. 6-11 show additional configurations of heat-dissipating elements.

FIGS. 6-11 show additional examples of heat-dissipating elements on various single-piece enclosures in the X-Y plane. FIG. 6 shows a second side 636 of an enclosure 630, FIG. 7 shows a second side 736 of an enclosure 730, FIG. 8 shows a second side 836 of an enclosure 830, FIG. 9 shows a second side 936 of an enclosure 930, FIG. 10 shows a second side 1036 of an enclosure 1030, and FIG. 11 shows a second side 1136 of an enclosure 1130.

Each of the enclosures 630, 730, 830, 930, 1030, and 1130 is a single-piece structure made of the material 133 and houses an electrical system such as the electrical system 120. Each enclosure 630, 730, 830, 930, 1030, and 1130 includes heat-dissipating elements that are made of the material 133 and are part of the enclosure 630. The enclosure 630 includes heat-dissipating elements 634, the enclosure 730 includes heat-dissipating elements 734, the enclosure 830 includes heat-dissipating elements 834, the enclosure 930 includes heat-dissipating elements 934, the enclosure 1030 includes heat-dissipating elements 1034, and the enclosure 1130 includes heat-dissipating elements 1134. The heat-dissipating elements 634, 734, 834, 934, 1034, and 1134 extend in the Z direction from the second side of their respective enclosure.

The heat-dissipating elements 634, 734, 834, 934, 1034, and 1134 are in various configurations and arrangements. For example, the heat-dissipating elements 634, 834, 934, 1034, and 1134 include elements with curved or waved portions. In another example, the heat-dissipating elements 934 include rod-like elements and wave-shaped elements.

Figure 12:
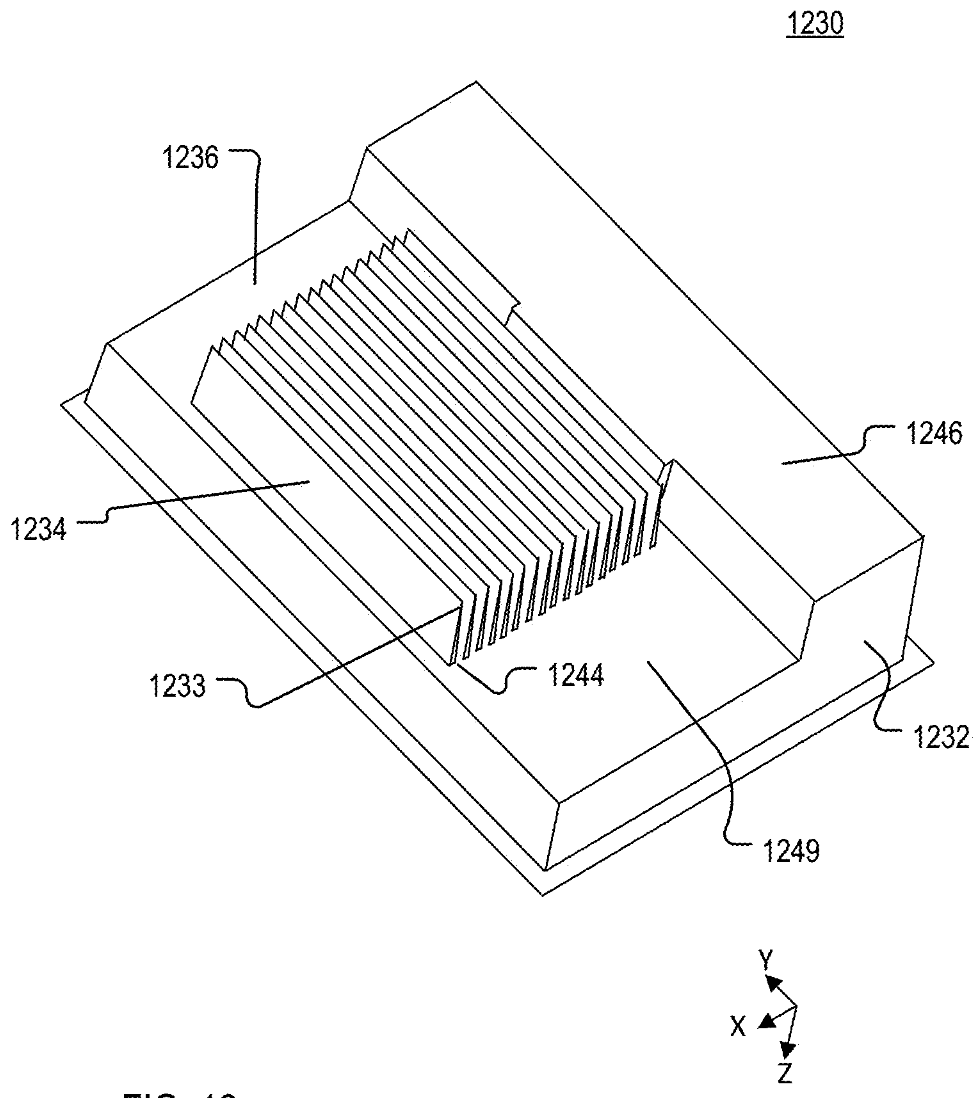
FIG. 12 is a perspective view of another example of an enclosure.

FIG. 12 is a perspective view of another example enclosure 1230. The enclosure 1230 is similar to the enclosure 430 (FIGS. 4A-4C and 4F). The enclosure 1230 includes a base portion 1232 that has a second side 1236 and heat-dissipating elements 1234 that extend in the −Z direction from a planar portion 1249 of the second side 1236. The enclosure 1230 is made of the material 133, and the base portion 1232 and the heat-dissipating elements 1234 are a single-piece structure of the material 133. The enclosure 1230 includes seventeen (17) heat-dissipating elements 1234. For simplicity, not all of the elements 1234 are labeled.

Each of the heat-dissipating elements 1234 is a fin that extends in the −Z direction from an end 1244, which is at the second side 1236, to a tip 1233. All of the heat-dissipating elements 1234 are substantially the same size. In the example of FIG. 12, each fin 1234 extends 175 mm in the Y direction and 40 mm in the −Z direction. The end 1244 extends 4 mm in the X direction and the tip 1233 has a taper angle of 2°. Other configurations and arrangements of the fins 1234 may be used, and more or fewer fins may be used.

The second side 1236 also includes a compartment 1246. The compartment 1246 forms a recess on a side of the base portion 1232 that is opposite to the second side 1236. The recess houses components that may be used with the electrical system 120.

The enclosure 1230 may be attached to a separate structure. For example, the mounting element 450 (FIGS. 4A and 4D) may be attached to the second side 1236. Moreover, the side of the enclosure 1230 opposite the second side 1236 may be attached to a drive panel.

These and other implementations are within the scope of the claims. For example, although the enclosures 130, 430, 530, 630, 730, 830, 930, 1030, 1130, and 1230 are shown as having generally rectangular portions and sides, any of the enclosures may have a different shape.

In another example, the enclosure 430 (FIGS. 4A-4C and 4F may be implemented without the thermally conductive spreader 435. In these implementations, the electrical system 120 is mounted directly to the first side 437 of the base portion 432.

In yet another example, the mounting element 450 and the enclosure 430 may be a single structure. In other words, the mounting element 450 may be part of the enclosure 430.

In yet another example, the base portion 132 (FIG. 1) may include a mounting element that is configured to mount the enclosure 130 to a separate structure, or the enclosure 130 may be attachable to a mounting element that is configured to mount the enclosure 130 to a separate structure.

What is claimed is:

1. An apparatus comprising:

a power converter comprising electronic switches, the electronic switches being controllable to produce a driver signal having a variable amplitude, frequency, and/or phase;

a single-piece base made of a thermally conductive polymer material, the single-piece base comprising:

a first side comprising a recess configured to receive the power converter;

a second side; and heat dissipating elements that extend from the second side, wherein the heat dissipating elements are configured to dissipate heat generated by the electronic switches, and each of the heat dissipating elements is made of the thermally conductive polymer material; and a single-piece thermally conductive spreader between the power converter and the first side, wherein the single-piece thermally conductive spreader is positioned over all of the heat dissipating elements, and the single-piece thermally conductive spreader is configured to distribute heat released from the electronic switches among the heat dissipating elements.

2. The apparatus of claim 1, wherein the single-piece thermally conductive spreader comprises a copper plate.

3. The apparatus of claim 1, further comprising a mounting element configured to attach to the second side of the single-piece base, wherein the mounting element is configured to mount the apparatus to a separate structure.

4. The apparatus of claim 3, wherein the mounting element comprises a first portion and a plurality of side portions that extend from the first portion, and, when the mounting element is attached to the second side of the single-piece base, the first portion extends over the heat dissipating elements and the side portions surround the heat dissipating elements.

5. The apparatus of claim 4, wherein at least one of the side portions comprises an opening configured to allow heat to flow away from the heat dissipating elements and out of the apparatus.

6. The apparatus of claim 5, further comprising an active heat removal element between the opening and the heat dissipating elements, the active heat removal element configured to remove heat from the heat dissipating elements; and, when the mounting element is attached to the second side, the opening is positioned to receive heat from the active heat removal element.

7. The apparatus of claim 6, wherein the active heat removal element comprises a fan.

8. The apparatus of claim 4, wherein one of the side portions comprises a plurality of openings that each pass through the one of the side portions; and when the mounting element is attached to the second side, each opening is positioned to receive heat from an active heat removal element.

9. The apparatus of claim 1, wherein each of the heat dissipating elements is a fin.

10. The apparatus of claim 9, wherein each fin extends from a first end to a second end, the first end being at the second side of the single-piece base, and each fin tapers to the second end such that the second end is thinner than the first end.

11. The apparatus of claim 1, wherein the heat dissipating elements are arranged in a pattern.

12. The apparatus of claim 1, wherein at least one of the heat dissipating elements has a different size and/or shape than at least one other of the heat dissipating elements.

13. The apparatus of claim 1, wherein the single-piece base further comprises side walls that extend from the first side and surround the recess that is configured to receive the power converter.

14. The apparatus of claim 13, wherein the power converter is enclosed in the single-piece base.

15. The apparatus of claim 1, wherein the thermally conductive polymer material comprises a polymer matrix and one or more thermally conductive fillers incorporated into the polymer matrix.

16. The apparatus of claim 1, wherein at least one of the electronic switches comprises an insulated-gate bipolar transistor (IGBT).

17. The apparatus of claim 1, wherein the single-piece base further comprises a mounting element configured to attach the single-piece base to a separate structure to thereby mount the apparatus to a separate structure.

18. The apparatus of claim 1, wherein each of the heat dissipating elements has the same size and shape.

19. The apparatus of claim 1, wherein the heat dissipating elements are spatially arranged on the second side in a non-uniform manner.

20. An enclosure comprising:

a single-piece base made of a thermally conductive polymer material, the single-piece base comprising:

a first side configured to receive a power converter comprising one or more controllable switches that generate heat in use;

a second side; and heat dissipating elements that extend from the second side, wherein the one or more heat dissipating elements are configured to dissipate heat generated by the one or more controllable switches, and each of the one or more heat dissipating elements is made of the thermally conductive polymer material;

a single-piece thermally conductive spreader between the power converter and the first side, wherein the single-piece thermally conductive spreader is positioned over all of the heat dissipating elements, and the single-piece thermally conductive spreader is configured to distribute heat generated from the one or more controllable switches among the heat dissipating elements; and a mounting structure comprising:

a first portion at the second side of the single-piece base; and side portions that extend from the first portion, wherein, when the mounting structure is attached to the second side of the single-piece base, the first portion extends over the heat dissipating elements.

21. The enclosure of claim 20, wherein the single-piece base is a molded structure of the thermally conductive polymer material.

22. The enclosure of claim 20, wherein the mounting structure is part of the single-piece base.

23. The enclosure of claim 20, wherein the mounting structure is separate from the single-piece base, and the first portion of the mounting structure is configured to attach to the second side of the single-piece base.

24. The enclosure of claim 20, wherein each of the heat dissipating elements has the same size and shape.

* * * * *